(12) United States Patent
Jin et al.

(10) Patent No.: US 12,133,408 B2
(45) Date of Patent: Oct. 29, 2024

(54) DISPLAY DEVICE AND METHOD OF MANUFACTURING THE SAME

(71) Applicant: Samsung Display Co., Ltd., Yongin-si (KR)

(72) Inventors: Kyong Bin Jin, Suwon-si (KR); Jin Young Jung, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 674 days.

(21) Appl. No.: 17/231,703

(22) Filed: Apr. 15, 2021

(65) Prior Publication Data

US 2021/0234121 A1 Jul. 29, 2021

Related U.S. Application Data

(62) Division of application No. 15/816,730, filed on Nov. 17, 2017, now Pat. No. 11,011,727.

(30) Foreign Application Priority Data

Nov. 17, 2016 (KR) ........................ 10-2016-0153220

(51) Int. Cl.
*H10K 50/842* (2023.01)
*H10K 50/86* (2023.01)
(Continued)

(52) U.S. Cl.
CPC ......... *H10K 50/8426* (2023.02); *H10K 71/00* (2023.02); *H10K 50/865* (2023.02); *H10K 59/131* (2023.02)

(58) Field of Classification Search
CPC .. H10K 50/8426; H10K 71/00; H10K 50/865; H10K 59/131; H10K 50/841;
(Continued)

(56) References Cited

U.S. PATENT DOCUMENTS

| 6,417,619 B1 | 7/2002 | Yasunori et al. |
| 2003/0057489 A1 | 3/2003 | Yamazaki |

(Continued)

FOREIGN PATENT DOCUMENTS

| JP | 2015087405 A | * | 5/2015 |
| KR | 10-2014-0092501 | | 7/2014 |

(Continued)

OTHER PUBLICATIONS

JP-2015087405-A Machine Translation of Description (Year: 2023).*

(Continued)

*Primary Examiner* — Cynthia L Schaller
(74) *Attorney, Agent, or Firm* — Lewis Roca Rothgerber Christie LLP (57) ABSTRACT

A display device and a method of manufacturing a display device are provided. A display device includes: a window; a first pattern on a portion of the window; a second pattern on at least a portion of the first pattern and having a higher surface free energy than the first pattern; an adhesive layer on the window, at least a portion of the adhesive layer being on the second pattern to be in contact with a surface of the second pattern; and a display panel on the adhesive layer.

5 Claims, 11 Drawing Sheets

(51) Int. Cl.
*H10K 59/131* (2023.01)
*H10K 71/00* (2023.01)

(58) Field of Classification Search
CPC ....... B32B 7/12; B32B 37/12; B32B 2305/72; B32B 2307/412; B32B 2457/206
See application file for complete search history.

(56) References Cited

U.S. PATENT DOCUMENTS

| | | |
|---|---|---|
| 2005/0146516 A1 | 7/2005 | Nishiyama |
| 2009/0115942 A1 | 5/2009 | Watanabe |
| 2010/0097552 A1* | 4/2010 | Shinya ................. C09J 133/066 522/182 |
| 2011/0199348 A1* | 8/2011 | Takatani ................. H04M 1/18 445/24 |
| 2012/0075838 A1* | 3/2012 | Lee ................... G02F 1/133308 359/601 |
| 2013/0201575 A1* | 8/2013 | Cheon ..................... F21V 11/00 359/893 |
| 2014/0028629 A1 | 1/2014 | Drumm et al. |
| 2014/0071537 A1 | 3/2014 | Park |
| 2015/0000836 A1* | 1/2015 | Ogawa ................. G02F 1/1303 156/273.5 |
| 2015/0212350 A1 | 7/2015 | Niiyama et al. |
| 2016/0139696 A1 | 5/2016 | Kim |
| 2016/0202799 A1 | 7/2016 | Imamura et al. |
| 2016/0255730 A1 | 9/2016 | Wang et al. |
| 2018/0297349 A1 | 10/2018 | Lim et al. |

FOREIGN PATENT DOCUMENTS

| | | |
|---|---|---|
| KR | 10-1423222 B1 | 7/2014 |
| KR | 10-2014-0141165 A | 12/2014 |
| KR | 10-1480672 B1 | 1/2015 |
| KR | 10-1503402 B1 | 3/2015 |
| KR | 10-1586837 B1 | 1/2016 |
| KR | 10-2016-0083191 | 7/2016 |
| KR | 10-1637565 B1 | 7/2016 |
| KR | 10-1640369 B1 | 7/2016 |
| KR | 10-1647004 B1 | 8/2016 |

OTHER PUBLICATIONS

Teikoku Printing Inks Mfg. Co., Ltd. "GIZ-HF ink series excellent resistance for solvent and adhesive," Technical Report, vol. 183, Jul. 29, 2019, 3 pages.

Solid surface energy data (SFE) for common polymers, Jun. 15, 2018, 1 page.

* cited by examiner

DISPLAY DEVICE AND METHOD OF MANUFACTURING THE SAME

CROSS-REFERENCE TO RELATED APPLICATIONS

This application is a divisional of U.S. patent application Ser. No. 15/816,730, filed on Nov. 17, 2017, which claims priority to and the benefit of Korean Patent Application No. 10-2016-0153220, filed on Nov. 17, 2016 in the Korean Intellectual Property Office, the entire disclosures of both of which are incorporated herein by reference.

BACKGROUND

1. Field

Aspects of embodiments of the present inventive concept relate to a display device and a method of manufacturing the same.

2. Description of the Related Art

A display device is a device that displays an image using an organic light emitting element or a liquid crystal element, for example. Display devices are applied to televisions, monitors, notebooks, tablet PCs, mobile phones, and the like.

A display device may include a window for protecting a display panel. Since mobile phones and tablet PCs are not fixedly installed and can be used while on the move, they are easily exposed to the external environment. In addition, if a touch function is added, an external force is continuously applied. Therefore, the function of the window is more important.

Generally, the window may be attached to the display panel by an adhesive material, such as a curable resin. In a conventional Y-Map method, a curable resin is applied in a Y shape to a rear surface of the window, and the window is bonded to the display panel. Then, after an electric field is applied to uniformly spread the resin, ultraviolet (UV) light is irradiated to cure the resin.

However, the Y-Map method tends to cause overflow because it is not easy to adjust the curable resin to an appropriate amount. When the resin overflows to an area that is hard to be reached by UV light due to driving elements such as a flexible printed circuit board (FPCB), it may spoil the appearance of the display device due to uncuring of the resin.

In a method developed in contrast to the Y-Map method, a curable resin is applied to the entire surface of the display panel using a slit nozzle that can line-apply or surface-apply resin. In this case, it is possible to apply resin in a relatively appropriate amount. However, since it is difficult to apply resin such that the resin is aligned with an edge of the display panel, the amount of resin is insufficient compared with the Y-Map method. Therefore, the adhesion between the window and the display panel may be reduced.

SUMMARY

According to an aspect of the present inventive concept, a display device is provided in which strong adhesion is maintained between a window and a display panel, even when an insufficient amount of adhesive material is interposed between the window and the display panel.

Aspects of the present inventive concept also provide a display device having improved adhesion between a window and a display panel.

However, aspects of the present inventive concept are not restricted to those set forth herein. The above and other aspects of the present inventive concept will become more apparent to one of ordinary skill in the art to which the inventive concept pertains by referencing the description of the inventive concept given below.

According to one or more embodiments of the present inventive concept, a display device comprises: a window; a first pattern disposed on a portion of the window; a second pattern disposed on at least a portion of the first pattern and having a higher surface free energy than the first pattern; an adhesive layer disposed on the window and at least a portion of which is disposed on the second pattern to be in contact with a surface of the second pattern; and a display panel disposed on the adhesive layer.

According to another aspect of the present inventive concept, a display device comprises: a window comprising a display area and a non-display area in a plan view; a light-shielding pattern disposed on the non-display area of the window and comprising a first area and a second area disposed further inward than the first area; a resin layer disposed on the window and at least a portion of which is disposed on the second area to be in contact with a surface of the second area; and a display panel disposed on the resin layer, and an edge of the display panel on at least one side protrudes further outward than a corresponding edge of the resin layer. According to an aspect, the second area has a higher surface free energy than the first area.

According to another aspect of the present inventive concept, a method of manufacturing a display device comprises: applying a photocurable resin to a display panel using a resin discharge nozzle; bonding a window having a first pattern and a second pattern to the display panel such that at least a portion of the applied resin is in contact with a surface of the second pattern; and curing the applied resin by irradiating light to the applied resin, and the first pattern and the second pattern which is disposed on at least a portion of the first pattern and has a higher surface free energy than the first pattern are disposed on a surface of the window.

BRIEF DESCRIPTION OF THE DRAWINGS

These and/or other aspects will become apparent and more readily appreciated from the following description of some embodiments, taken in conjunction with the accompanying drawings, in which.

DETAILED DESCRIPTION

Features of the invention and methods of accomplishing the same may be understood more readily by reference to the following description of some preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art.

It is to be understood that when an element or layer is referred to as being "on," "connected to," or "coupled to" another element or layer, the element or layer can be directly on, connected, or coupled to another element or layer, or one or more intervening elements or layers may be present. In contrast, when an element is referred to as being "directly on," "directly connected to," or "directly coupled to" another element or layer, there are no intervening elements or layers present. As used herein, "connected" may refer to elements being physically, electrically, and/or fluidly connected to each other.

Like numbers refer to like elements throughout. As used herein, the term "and/or" includes any and all combinations of one or more of the associated listed items.

It is to be understood that, although the terms "first," "second," "third," etc., may be used herein to describe various elements, components, regions, layers and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the invention.

The terminology used herein is for the purpose of describing particular embodiments only and is not intended to be limiting. As used herein, the singular forms "a," "an," and "the" are intended to include the plural forms as well, including "at least one," unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

Hereinafter, some embodiments of the present inventive concept will be described with reference to the accompanying drawings.

Display devices according to embodiments of the present inventive concept may be light receiving display devices, such as liquid crystal displays and electrophoretic devices, or may be self-luminous display devices, such as organic light emitting displays and plasma displays. A frameless organic light emitting display without a top cover for covering part of an upper portion of a display device or a narrow bezel organic light emitting display having a thin bezel will herein be described as an example for purposes of illustration. However, display devices according to embodiments are not limited to the frameless organic light emitting display or the narrow bezel organic light emitting display.

Figure 1:
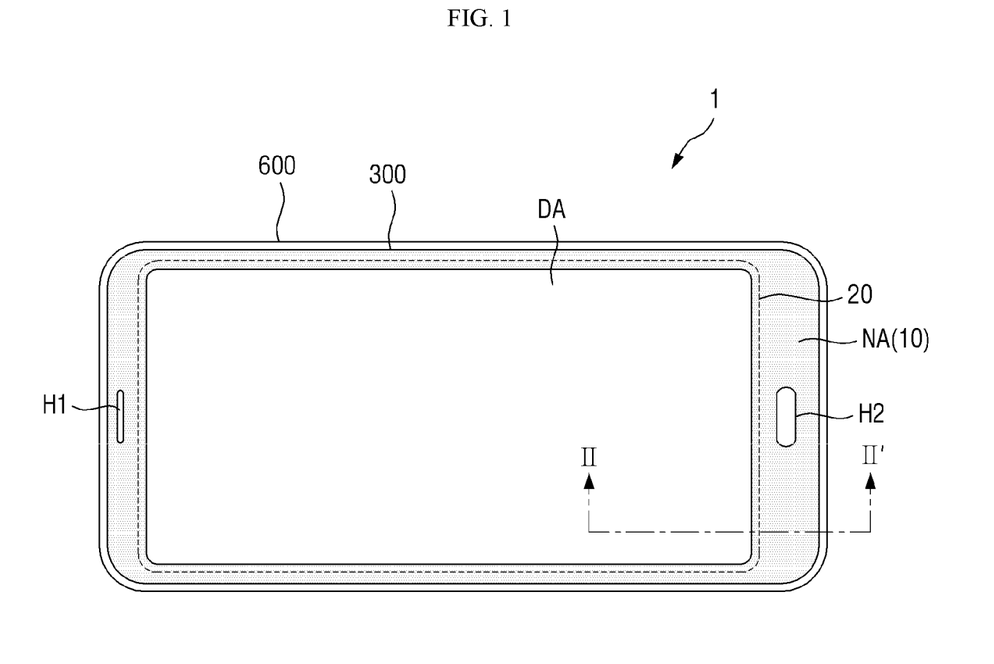
FIG. 1 is a plan view of a display device according to an embodiment.
Figure 2:
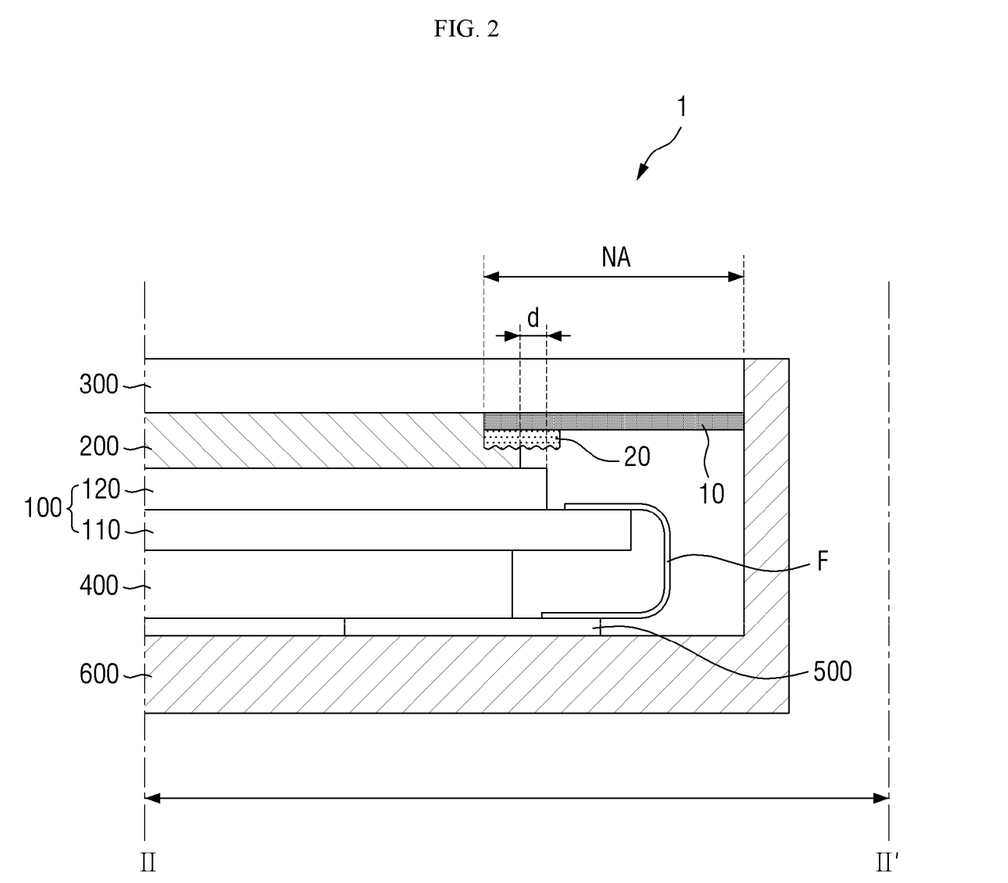
FIG. 2 is a partial cross-sectional view of the display device of FIG. 1, taken along the line II-II'.

FIG. 1 is a plan view of a display device 1 according to an embodiment; and FIG. 2 is a partial cross-sectional view taken along the line II-II' of FIG. 1.

Referring to FIGS. 1 and 2, the display device 1 includes a window 300 and a chassis 600.

The window 300 can protect a display panel 100 from external impact while allowing an image displayed by the display panel 100 included in the display device 1 to be viewed. In the drawings, the window 300 may be shaped like, but is not limited to, a quadrilateral having each corner rounded or curved in a plan view.

The window 300 includes a display area DA and a non-display area NA in a plan view. The display area DA is an area in which an image displayed by the display panel 100 is visible, and the non-display area NA is an area in which the image is not visible. In an embodiment, the non-display area NA is disposed around the display area DA. For example, when the display area DA is formed in a quadrilateral shape, the non-display area NA may be disposed outside the display area DA along edges of the display area DA.

A hole H1 corresponding to a speaker or camera area of the display device 1, and a hole H2 corresponding to a button area may be formed in the non-display area NA of the window 300.

A plurality of pixels (not illustrated) may be defined in the display area DA. The pixels may be arranged in a matrix form. Signal lines for driving each pixel, for example, a gate line (not illustrated) and a data line (not illustrated) may be disposed at the boundary of each pixel.

A portion to which an external driving element, such as a driving chip or a printed circuit board (PCB) 500, is connected may be located in the non-display area NA.

The chassis 600 may accommodate elements of the display device 1 including the window 300. The chassis 600 may be shaped as a plate having a bottom and sidewalls. The sidewalls of the chassis 600 (e.g., a planar chassis) may surround the edges of the window 300 in a plan view.

The display device 1 may further include a first pattern 10 disposed on a lower surface of the window 300, and a second pattern 20 disposed on a lower surface of the first pattern 10. The first pattern 10 may overlap the non-display area NA of the window 300 in a plan view. The second pattern 20 may be disposed in the non-display area NA along the edges of the display area DA in a plan view.

The cross-sectional structure of the display device 1 including the first pattern 10 and the second pattern 20 will now be described in further detail with reference to FIG. 2.

Referring to FIG. 2, the display device 1 includes the chassis 600, the PCB 500, a flexible printed circuit board (FPCB) F, a protective layer 400, the display panel 100, an adhesive layer 200, the window 300, the first pattern 10, and the second pattern 20.

The chassis 600 is disposed in a lower part of the display device 1. As described above, the chassis 600 may be shaped as a plate having a bottom and sidewalls so as to accommodate elements of the display device 1.

The PCB 500 may be disposed on the bottom of the chassis 600. The PCB 500 may transmit a driving signal or the like utilized for the display panel 100 to display an image to the display panel 100 through the FPCB F.

The protective layer 400 may be disposed on the PCB 500. The protective layer 400 is a layer for protecting elements within the display device 1 from physical and chemical impacts externally applied and may include a cushion layer (not illustrated) or a protective film (not illustrated).

The display panel 100 may be disposed on the protective layer 400. The display panel 100 is an element for realizing an image and may include a first substrate 110 and a second substrate 120 disposed on the first substrate 110.

The first substrate 110 may be a substrate on which thin-film transistors (TFTs), i.e. switching elements, are formed in a matrix form. A data line and a gate line may be respectively connected to a source terminal and a gate terminal of each of the TFTs, and a pixel electrode (not illustrated) made of a conductive material may be connected to a drain terminal of each of the TFTs.

A gate pad (not illustrated) and a data pad (not illustrated) connected to an end of the gate line and an end of the data line, respectively, may be disposed in an area corresponding to the non-display area NA of the first substrate 110 in a plan view. The gate pad and the data pad may be electrically connected to the PCB 500 by the FPCB F to receive a driving signal or the like.

The second substrate 120 may be disposed to face the first substrate 110. A common electrode (not illustrated) made of a conductive material may be formed on the second substrate 120 to face the pixel electrode formed on the first substrate 110. In an embodiment, RGB pixels for implementing colors may be formed on the second substrate 120 in the form of thin films.

Although not illustrated in the drawings, the display panel 100 may further include an organic light emitting element interposed between the first substrate 110 and the second substrate 120. In this case, the second substrate 120 may include a protective layer, a sealing layer, an encapsulation layer, or the like for protecting the organic light emitting element.

In one or more embodiments, the display panel 100 may further include an attached or embedded touch sensing unit (not illustrated) or polarizing element (not illustrated).

The adhesive layer 200 may be disposed on the display panel 100. The adhesive layer 200 is a layer for bonding and fixing the display panel 100 and the window 300 together and may include an adhesive material, such as a photocured resin.

The photocured resin may be a material that exhibits adhesive strength. In an embodiment, the photocured resin is obtained by polymerizing and thus curing a photocurable resin consisting of monomers, oligomers, etc. by irradiating light of a specific wavelength to the photocurable resin.

In an embodiment, the photocurable resin may be a material that is cured by ultraviolet (UV) irradiation.

In an embodiment, the photocurable resin may include acryl and/or a (meth) acrylic compound.

In an embodiment, the photocurable resin may further include a photoinitiator that generates free radicals or ions in response to photic stimulation, such as UV light. Examples of the photoinitiator include, but are not limited to, alpha-hydroxy ketone, mono- or bisacyl phosphine oxide, benzophenone, thioxanthone, ketosulfone, benzyl ketal, phenylglyoxylate, borate, titanocene and oxime ester-based photoinitiators.

In addition to the photocured resin, resins cured by stimulation of temperature, humidity, physical impact, chemicals, etc. can be included in the adhesive layer 200, and any material that is cured to become adhesive can be included in the adhesive layer 200 regardless of the type of stimulation that triggers the curing.

In an embodiment, a surface of the adhesive layer 200 on at least one side may be disposed further inward than a surface of the display panel 100 on the same side. That is, an edge of the display panel 100 may protrude further outward than an edge of the adhesive layer 200 when seen in a cross-sectional view.

The adhesive layer 200 may be included on the second substrate 120 in a plan view. In an embodiment, an end of the second substrate 120 may extend further outward than an end of the adhesive layer 200 on all sides by a distance (e.g., a predetermined distance) d.

However, the arrangement of the adhesive layer 200 and the display panel 100 is not limited to the above-described structure. In an embodiment, when the amount of material that forms the adhesive layer 200 is appropriate, the edge of the display panel 100 and the edge of the adhesive layer 200 may be aligned with each other. When the material that forms the adhesive layer 200 overflows, the edge of the adhesive layer 200 may protrude further outward than the edge of the display panel 100.

The window 300 may be disposed on the adhesive layer 200. The window 300 may have an area that covers the elements of the display device 1 housed by the chassis 600. As described above, the window 300 can protect the display panel 100 from external impact while allowing an image displayed by the display panel 100 to be visible.

The first pattern 10 may be disposed on the lower surface of the window 300. The first pattern 10 may be a patterned layer printed on the lower surface of the window 300. The first pattern 10 may overlap the non-display area NA of the window 300 in a plan view. In one or more embodiments, the first pattern 10 may have the same area as the non-display area NA to completely overlap the non-display area NA.

The first pattern 10 may be a light-shielding pattern for blocking light transmission. In an embodiment, the first pattern 10 may include carbon black, dye, pigment, paint, and the like to have a color that substantially blocks light transmission. When the first pattern 10 is a light-shielding pattern, the non-display area NA may be an area where light emitted from the display panel 100 is blocked by the first pattern 10.

The first pattern 10 may have a smooth surface with a low surface energy or surface tension, such that the first pattern 10 can be easily cleaned when the surface of the first pattern 10 is stained with the material that forms the adhesive layer 200. In an embodiment, the surface tension of the first pattern 10 may be 30 dyne/cm or less.

The second pattern 20 may be disposed on the lower surface of the first pattern 10. The second pattern 20 may be a patterned layer printed on the lower surface of the first pattern 10. The second pattern 20 may overlap at least a portion of the first pattern 10. In an embodiment, as shown in FIGS. 1 and 2, the second pattern 20 is disposed along inner edges of the first pattern 10.

The second pattern 20 may overlap a portion of the adhesive layer 200. In an embodiment, an outer portion of the adhesive layer 200 may be disposed on a lower surface of the second pattern 20 to overlap at least a portion of the second pattern 20. In this case, surfaces of the adhesive layer 200 and the second pattern 20 may contact each other in the overlapping portion.

A surface of the second pattern 20 which faces the adhesive layer 200 may have a higher surface energy or surface tension than that of the first pattern 10. In an embodiment, the second pattern 20 may have a surface tension of 34 dyne/cm or more, and the first pattern 10 may have a surface tension of less than 34 dyne/cm. In another embodiment, the surface tension of the first pattern 10 may be 30 dyne/cm or less, and the surface tension of the second pattern 20 may exceed 30 dyne/cm. That is, an appropriate value can be selected for the surface tension of the second pattern 20 within a range in which the surface tension of the second pattern 20 is higher than that of the first pattern 10.

In one or more embodiments, the surface energy or surface tension of the second pattern 20 may be increased by increasing the surface roughness of the second pattern 20 by forming irregularities on the surface of the second pattern 20 or may be increased by forming the second pattern 20 of a rough material on the lower surface of the first pattern 10.

In an embodiment, to increase the surface roughness, fumed silica may be injected into the surface of the second pattern 20, as an example.

In the display device 1 described above, the second pattern 20 having a relatively high surface energy is securely bonded to a portion of the adhesive layer 200. Therefore, the adhesive layer 200 can be prevented from being easily separated from the window 300 having the second pattern 20.

In addition, since the first pattern 10 has a smooth surface with a relatively low surface energy, the adhesive material that forms the adhesive layer 200 can be easily removed from the first pattern 10 when the adhesive material overflows to the surface of the first pattern 10.

Figure 3:
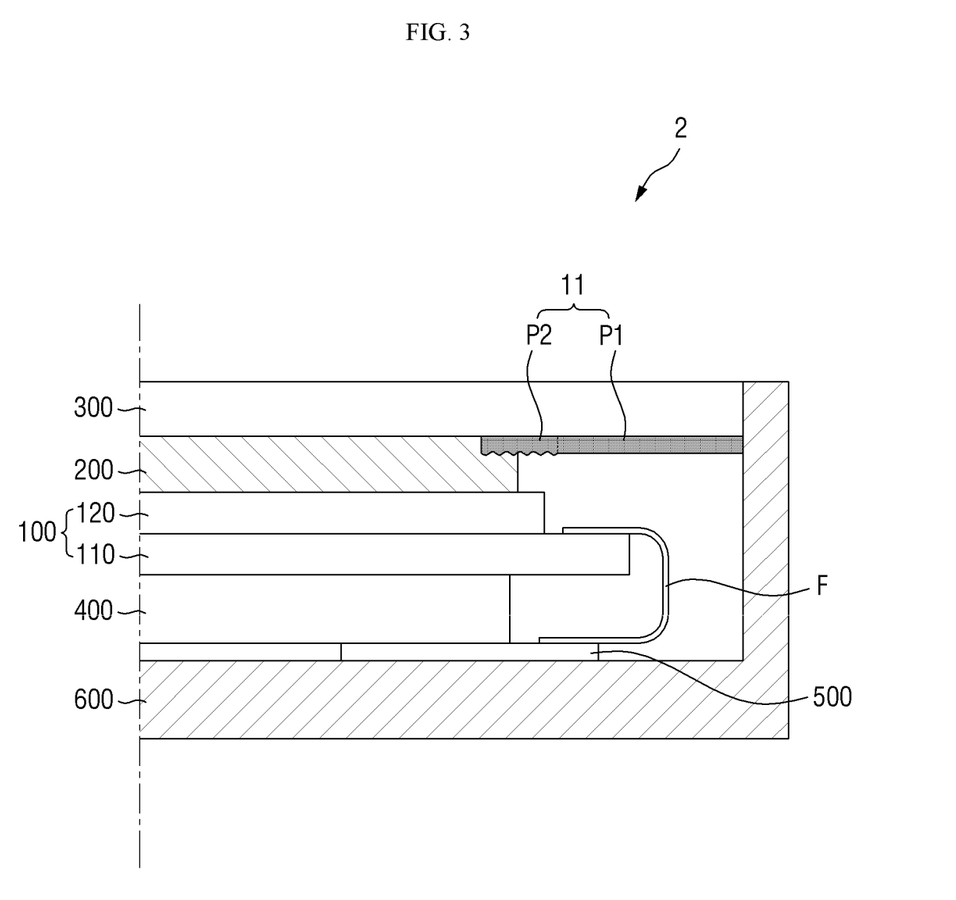
FIGS. 3 through 6 are partial cross-sectional views of display devices according to embodiments.

FIG. 3 is a partial cross-sectional view of a display device 2 according to an embodiment.

The display device 2 of FIG. 3 is the same as the display device 1 of FIG. 2 except that it does not include the second pattern 20 and includes a first pattern 11 divided into a first area P1 and a second area P2. Thus, any redundant description will be omitted below.

Referring to FIG. 3, the first pattern 11 may include the first area P1 and the second area P2 disposed on an inner side of the first area P1.

The second area P2 may overlap a portion of the adhesive layer 200. An outer portion of the adhesive layer 200 may be disposed on a lower surface of the second area P2 to overlap at least a portion of the second area P2. In this case, surfaces of the adhesive layer 200 and the second area P2 may contact each other in the overlapping portion.

A surface of the second area P2 which faces the adhesive layer 200 may have a higher surface energy or surface tension than that of the first area P1. In an embodiment, the second area P2 may have a surface tension of 34 dyne/cm or more, and the first area P1 may have a surface tension of less than 34 dyne/cm. However, in another embodiment, the surface tension of the first area P1 may be 30 dyne/cm or less, and the surface tension of the second area P2 may exceed 30 dyne/cm.

The second area P2 may be formed by, but is not limited to, injecting fumed silica into a portion of a smooth surface of the first pattern 11.

The first area P1 and the second area P2 may be an integrated layer made of substantially the same material except for their surfaces. In an embodiment, both the first area P1 and the second area P2 may function as light-shielding patterns for blocking light transmission.

The display device 2 of FIG. 3 described above can also prevent the window 300 and the adhesive layer 200 from being easily separated from each other through the second area P2 having a high surface energy, and can allow an overflowed adhesive material to be easily removed through the first area P1 having a low surface energy. In addition, by forming an area having a different surface in the first pattern 11 instead of forming a second pattern, it is possible to prevent a phenomenon in which a second pattern is peeled off from a first pattern.

Figure 4:
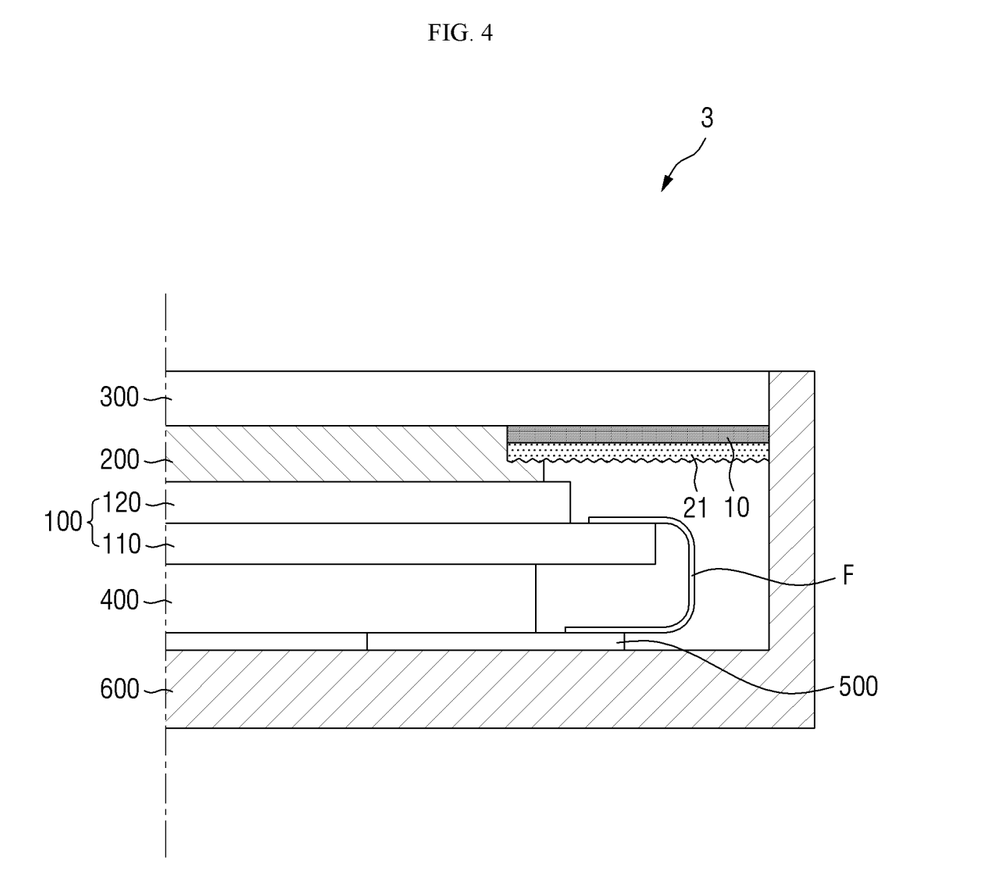

FIG. 4 is a partial cross-sectional view of a display device 3 according to an embodiment.

The display device 3 of FIG. 4 is the same as the display device 1 of FIG. 2 except that a second pattern 21 completely covers the first pattern 10. Thus, any redundant description will be omitted below.

Referring to FIG. 4, the second pattern 21 may be disposed on a lower surface of the first pattern 10 to completely cover the first pattern 10. In an embodiment, the surface energy or surface tension of each of the second pattern 21 and the first pattern 10 is as described above with reference to FIG. 2.

The display device 3 of FIG. 4 described above can also prevent the window 300 and the adhesive layer 200 from being easily separated from each other through the second pattern 21 having a high surface energy. Furthermore, since the second pattern 21 completely covers the first pattern 10, strong adhesion can be maintained between the adhesive layer 200 and the second pattern 21, even when an outer portion of the adhesive layer 200 is extended or overflows due to a large amount of material that forms the adhesive layer 200.

Figure 5:
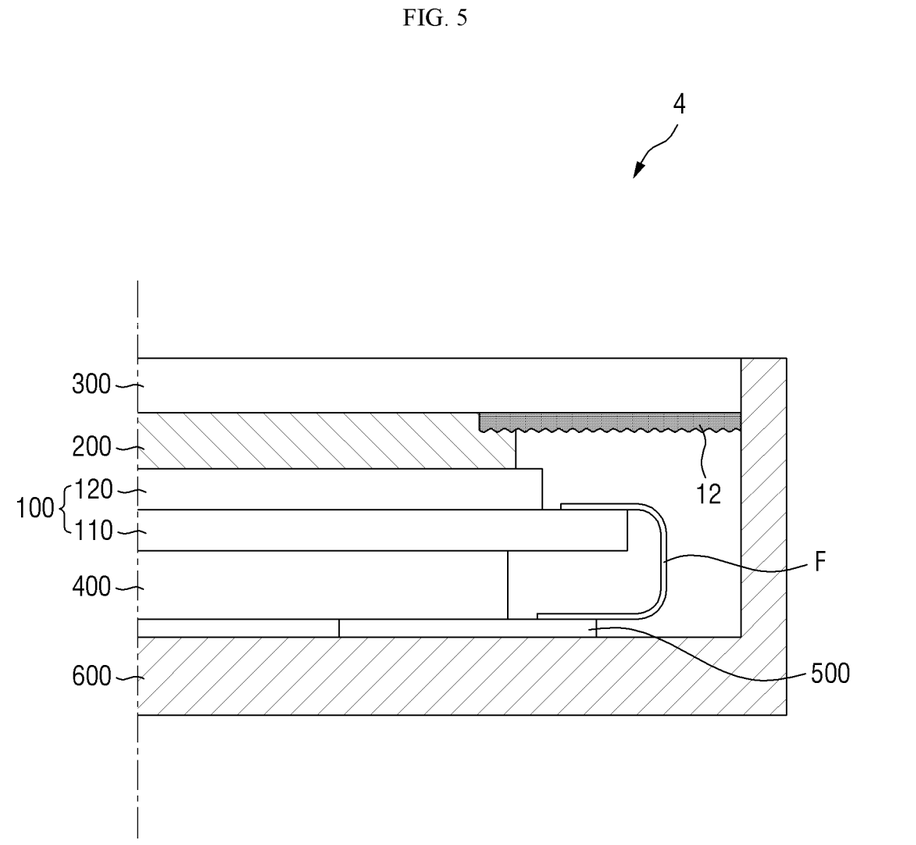

FIG. 5 is a partial cross-sectional view of a display device 4 according to an embodiment.

The display device 4 of FIG. 5 is the same as the display device 1 of FIG. 2 except that it does not include the second pattern 20 and includes a first pattern 12 having a rough surface. Thus, any redundant description will be omitted below.

Referring to FIG. 5, the entire lower surface of the first pattern 12 may be a rough surface having a high surface energy or a high surface tension. In an embodiment, the first pattern 12 may have a surface tension of 30 dyne/cm or more, and, in an embodiment, a surface tension of 34 dyne/cm or more.

The first pattern 12 may overlap a portion of the adhesive layer 200. An outer portion of the adhesive layer 200 may be disposed on the lower surface of the first pattern 12 to overlap at least a portion of the first pattern 12. In this case, surfaces of the adhesive layer 200 and the first pattern 12 may contact each other in the overlapping portion.

The display device 4 of FIG. 5 described above can also prevent the window 300 and the adhesive layer 200 from being easily separated from each other through the first pattern 12 having a high surface energy. In addition, since a second pattern is not additionally formed, a phenomenon in which a second pattern is peeled off from the first pattern 12 can be prevented. Furthermore, strong adhesion can be maintained between the adhesive layer 200 and the first pattern 12, even when the outer portion of the adhesive layer 200 is extended or overflows due to a large amount of material that forms the adhesive layer 200.

Figure 6:
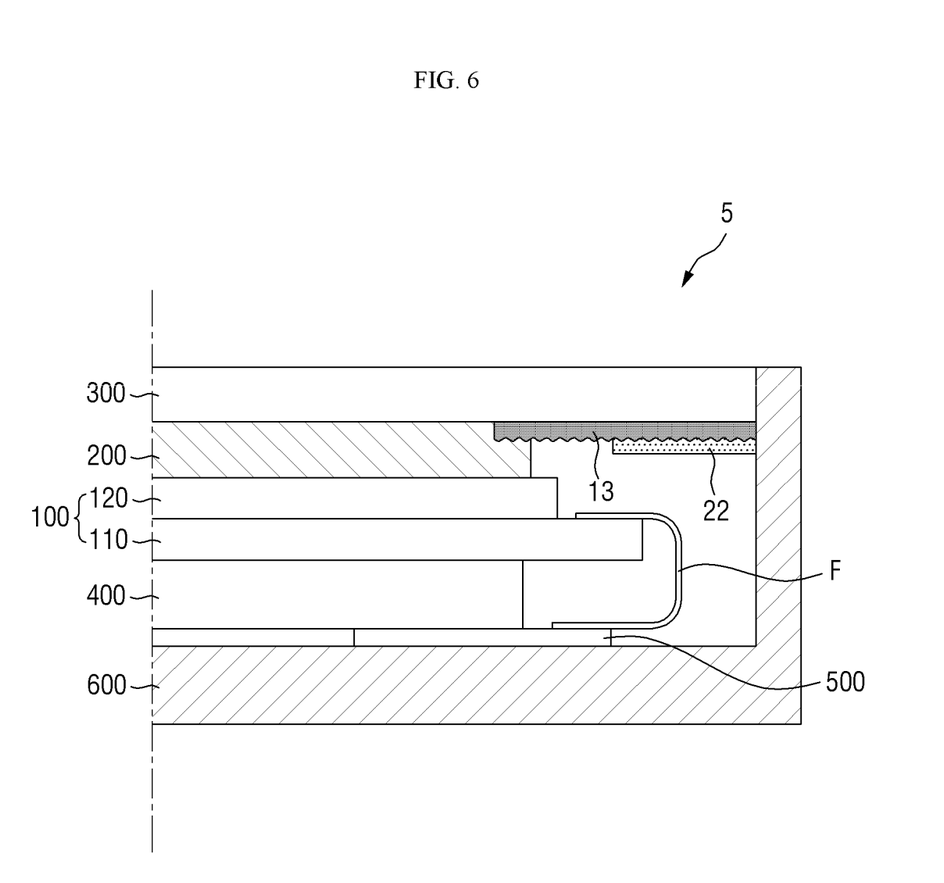

FIG. 6 is a partial cross-sectional view of a display device 5 according to an embodiment.

The display device 5 of FIG. 6 is the same as the display device 1 of FIG. 2 except that a first pattern 13 has a higher surface energy than a second pattern 22, and the second pattern 22 is disposed along outer edges of the first pattern 13. Thus, any redundant description will be omitted below.

Referring to FIG. 6, the second pattern 22 may be disposed on a lower surface of the first pattern 13 along the outer edges of the first pattern 13. Accordingly, the first pattern 13 may be in contact with a portion of an adhesive layer 200. An outer portion of the adhesive layer 200 may be disposed on the lower surface of the first pattern 13 to be in contact with the surface of the first pattern 13.

A surface of the first pattern 13 which faces the adhesive layer 200 may have a higher surface energy or surface tension than that of the second pattern 22. In an embodiment, the first pattern 13 may have a surface tension of 34 dyne/cm or more, and the second pattern 22 may have a surface tension of less than 34 dyne/cm. In another embodiment, the surface tension of the second pattern 22 is 30 dyne/cm or less, and the surface tension of the first pattern 13 may exceed 30 dyne/cm. That is, an appropriate value can be selected for the surface tension of the first pattern 13 within a range in which the surface tension of the first pattern 13 is higher than that of the second pattern 22.

The display device 5 of FIG. 6 described above can also prevent the window 300 and the adhesive layer 200 from being easily separated from each other through the first pattern 13 having a high surface energy, and can easily remove an overflowed adhesive material through the second pattern 22 having a low surface energy.

Figure 7:
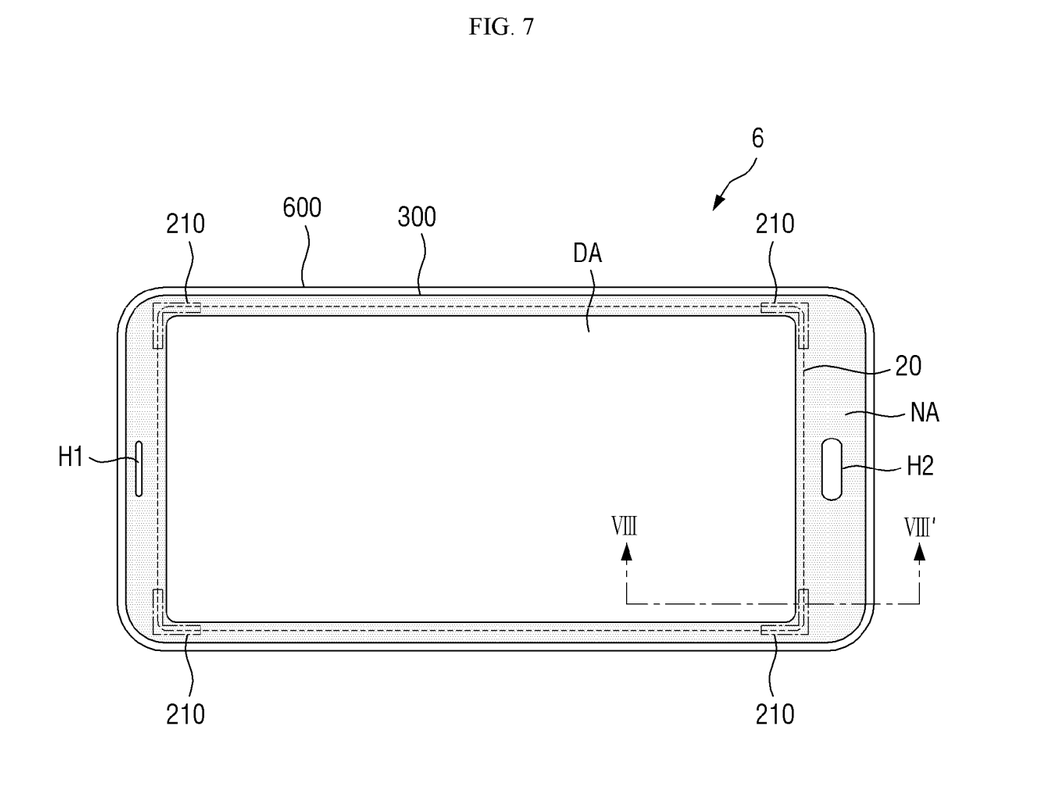
FIG. 7 is a plan view of a display device according to an embodiment.
Figure 8:
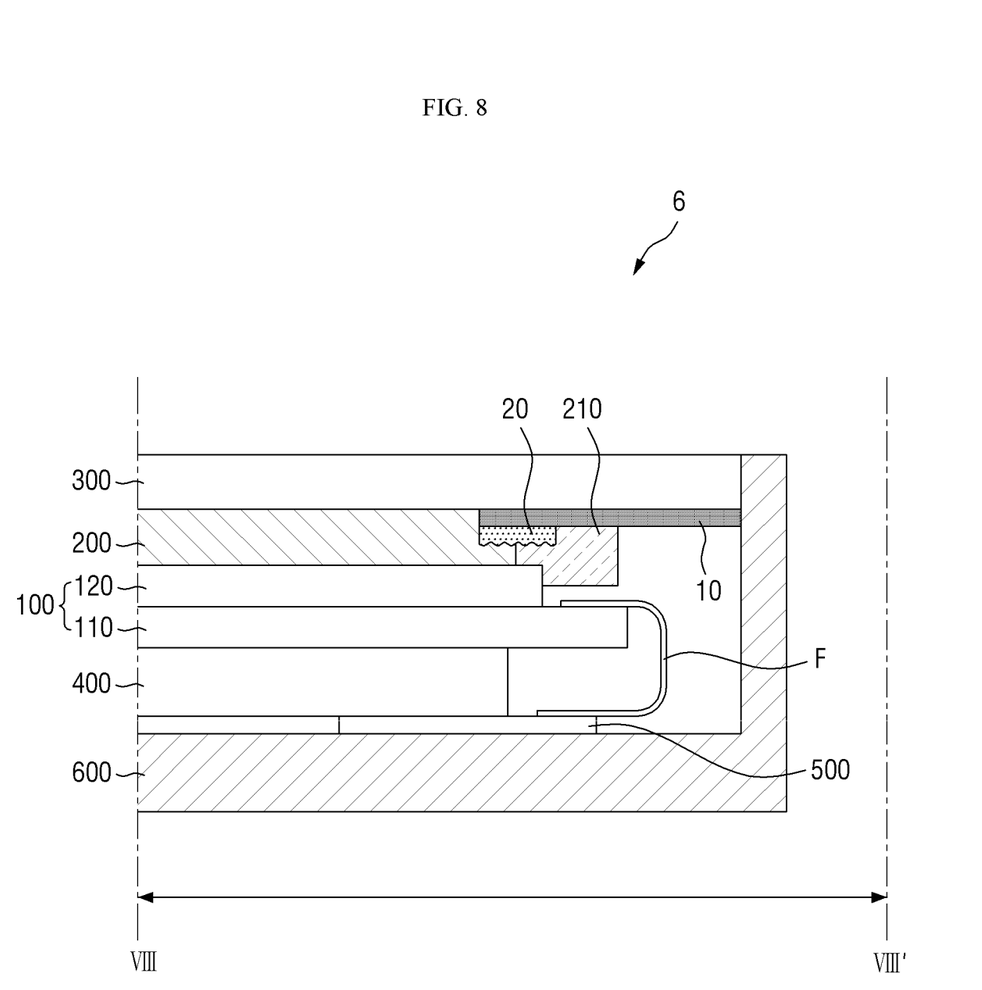
FIG. 8 is a partial cross-sectional view of the display device of FIG. 7, taken along the line VIII-VIII'.

FIG. 7 is a plan view of a display device 6 according to an embodiment; and FIG. 8 is a partial cross-sectional view, taken along the line VIII-VIII' of FIG. 7.

The display device 6 of FIGS. 7 and 8 is the same as the display device 1 of FIGS. 1 and 2 except that it further includes an auxiliary sealing layer 210. Thus, any redundant description will be omitted below.

Referring to FIGS. 7 and 8, the display device 6 may further include the auxiliary sealing layer 210 which covers a side surface of the display panel 100 and a side surface of the adhesive layer 200. The auxiliary sealing layer 210 may cover at least a portion of the side surface of the display panel 100 and at least a portion of the side surface of the adhesive layer 200.

When the adhesive layer 200 is formed to have a smaller area than the display panel 100 in a plan view due to a small amount of material that forms the adhesive layer 200, the adhesion between the adhesive layer 200 and the display panel 100 may be insufficient. Therefore, the adhesion between the display panel 100 and the adhesive layer 200 may be supplemented by the auxiliary sealing layer 210 which is in contact with both the display panel 100 and the adhesive layer 200.

In one or more embodiments, the auxiliary sealing layer 210 may contact a surface of at least one of the first pattern 10 and the second pattern 20 disposed on the window 300 while contacting the side surface of each of the display panel 100 and the adhesive layer 200. Accordingly, the display panel 100, the adhesive layer 200, and the window 300 can be securely bonded to each other.

In an embodiment, the auxiliary sealing layer 210 may be disposed in an area corresponding to each corner of the display panel 100 and the adhesive layer 200 in a plan view. However, the position of the auxiliary sealing layer 210 is not limited to this example, and, in another embodiment, the auxiliary sealing layer 210 can be disposed along all edges of the display panel 100 and the adhesive layer 200.

The auxiliary sealing layer 210 may include an adhesive material, such as photocured resin. In embodiments, the auxiliary sealing layer 210 may include one or more of the materials exemplified as an adhesive material or photocured resin that can be included in the adhesive layer 200.

In an embodiment, the adhesive layer 200 and the auxiliary sealing layer 210 may include materials obtained by curing photocurable resins of the same components through light irradiation, or may include materials cured by irradiation of light of the same wavelength. However, in other embodiments, the adhesive layer 200 and the auxiliary sealing layer 210 may include different materials or materials cured by irradiation of light of different wavelengths.

Herein, a method of manufacturing a display device of the present inventive concept will be described in further detail.

FIGS. 9 through 13 are schematic views for explaining operations of a method of manufacturing a display device according to embodiments.

Figure 9:
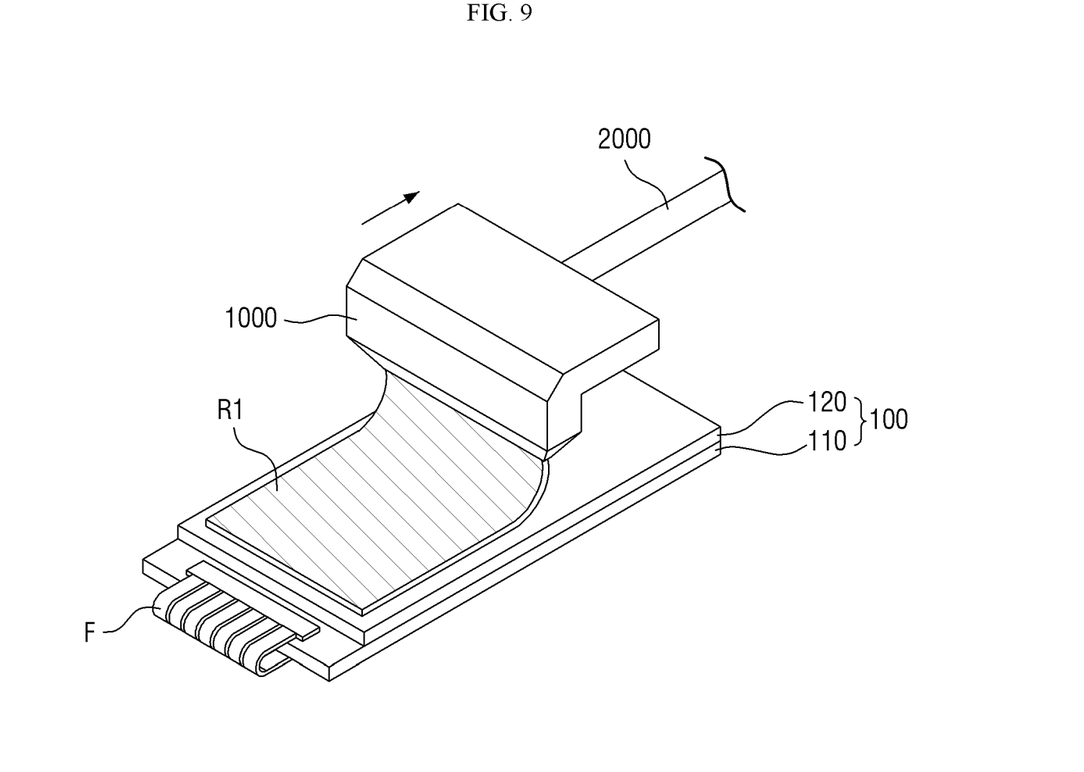
FIGS. 9 through 13 are schematic views for explaining operations of a method of manufacturing a display device according to embodiments.

Referring to FIG. 9, a photocurable resin R1 is applied to a surface of a display panel 100 including a first substrate 110 and a second substrate 120 bonded together.

In an embodiment, the photocurable resin R1 may be applied onto a surface of the second substrate 120 which is opposite a surface facing the first substrate 110 by using a resin discharge nozzle 1000. The resin discharge nozzle 1000 is a device that receives a liquid resin from a supply line 2000 and discharges or dispenses the resin. Unlike a conventional Y-Map nozzle, the resin discharge nozzle 1000 may be a slit nozzle that can surface-apply or line-apply resin.

A case where UV-curable resin is used as the photocurable resin R1 will be described below as an example.

Figure 10:
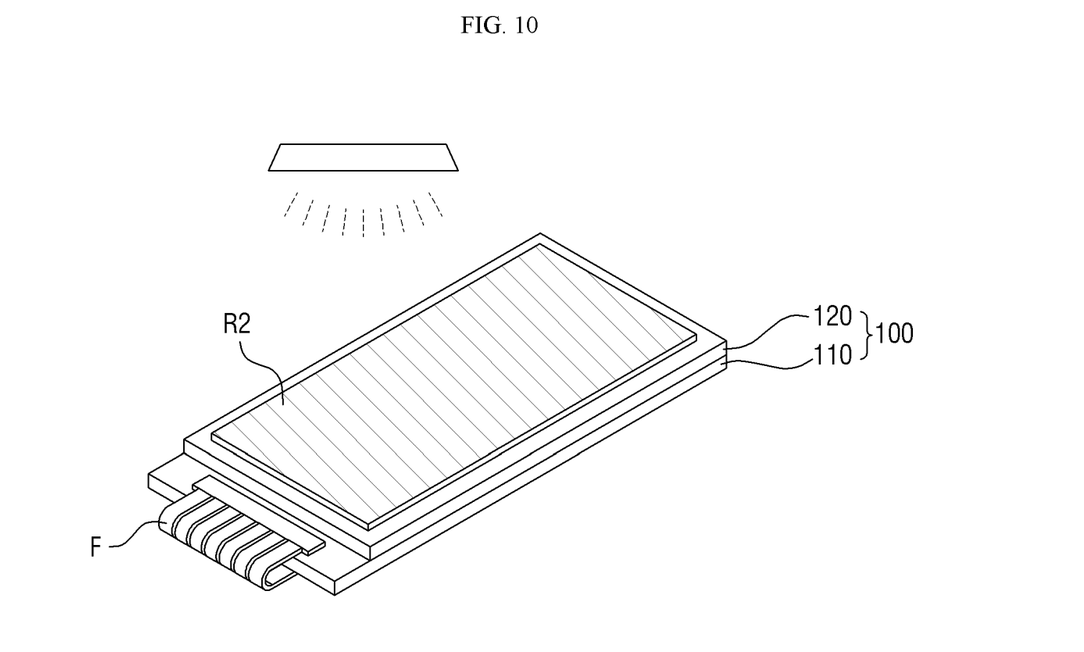

Referring to FIG. 10, the photocurable resin R1 applied to the second substrate 120 is pre-cured.

In an embodiment, UV light is irradiated to the photocurable resin R1 on the second substrate 120 for a short time to perform a pre-curing operation in which the photocurable resin R1 is incompletely cured from a liquid state to a gel state to be a pre-cured photocurable resin R2. In an embodiment, the pre-curing operation may be omitted.

Figure 11:
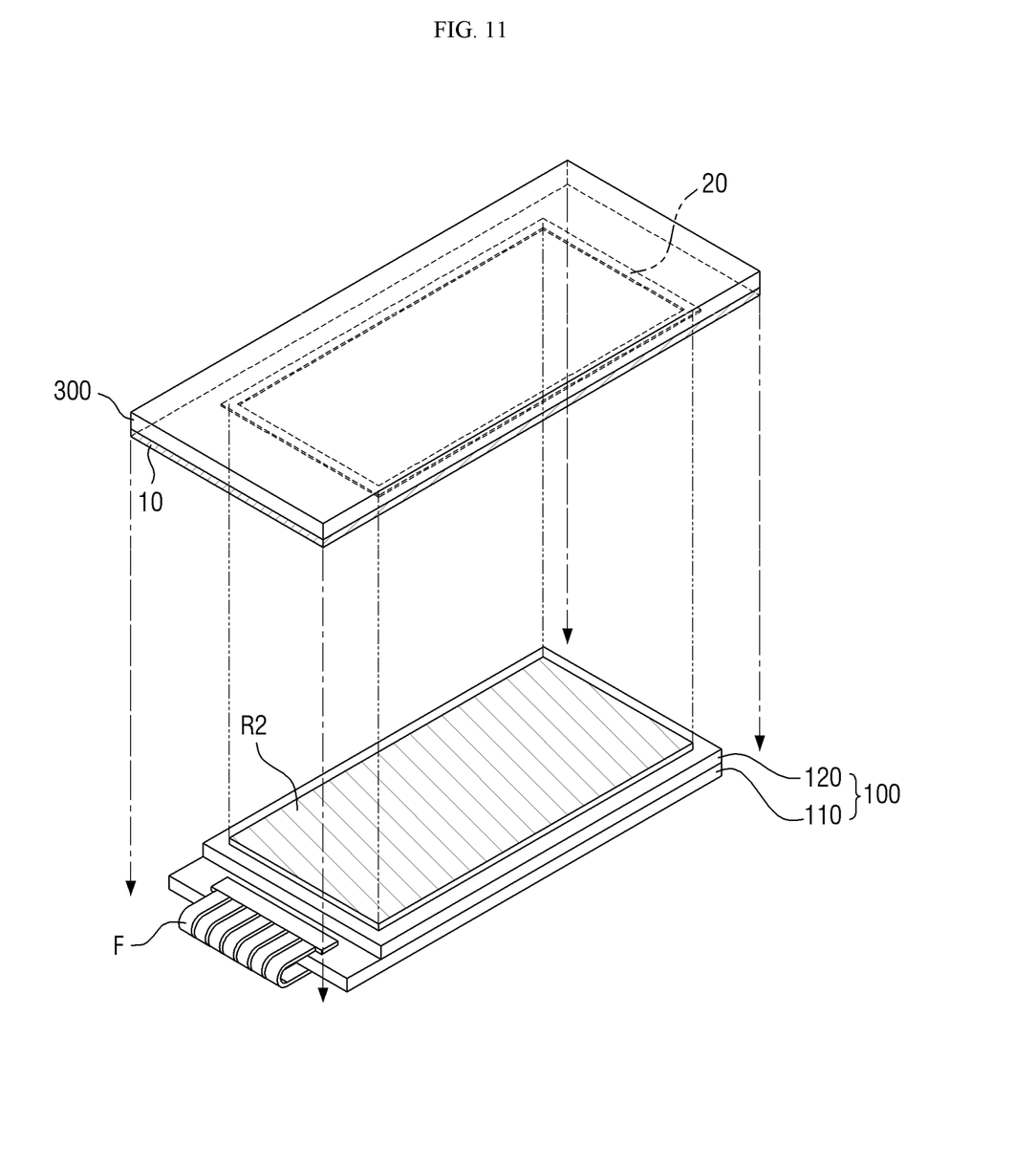

Referring to FIG. 11, a window 300 is bonded to the display panel 100 coated with the photocurable resin R2. The window 300 has a first pattern 10 and a second pattern 20 on its lower surface. The window 300 is bonded to the display panel 100 such that the second pattern 20 contacts at least a portion of the photocurable resin R2.

Figure 12:
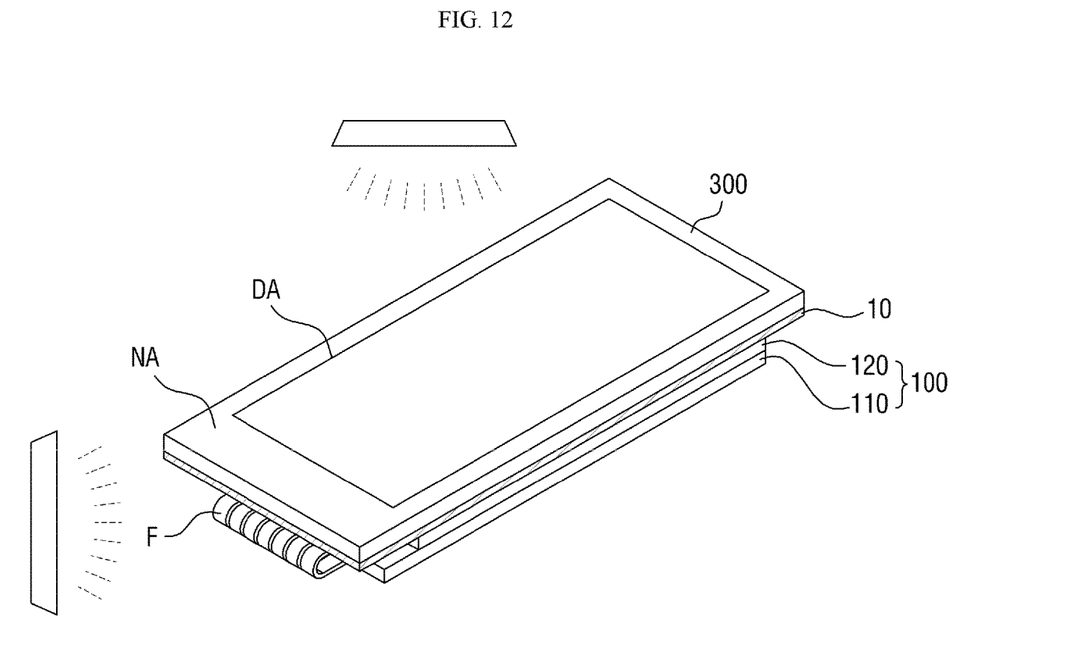

Referring to FIG. 12, an adhesive layer, such as the adhesive layer 200 described above, is formed by curing the photocurable resin R2 disposed between the display panel 100 and the window 300.

In an embodiment, a resin that overlaps a display area DA of the window 300 may be cured by irradiating UV light to an upper surface of the window 300, and a resin that overlaps a non-display area NA of the window 300 may be cured by irradiating UV light to a side surface of the window 300.

Figure 13:
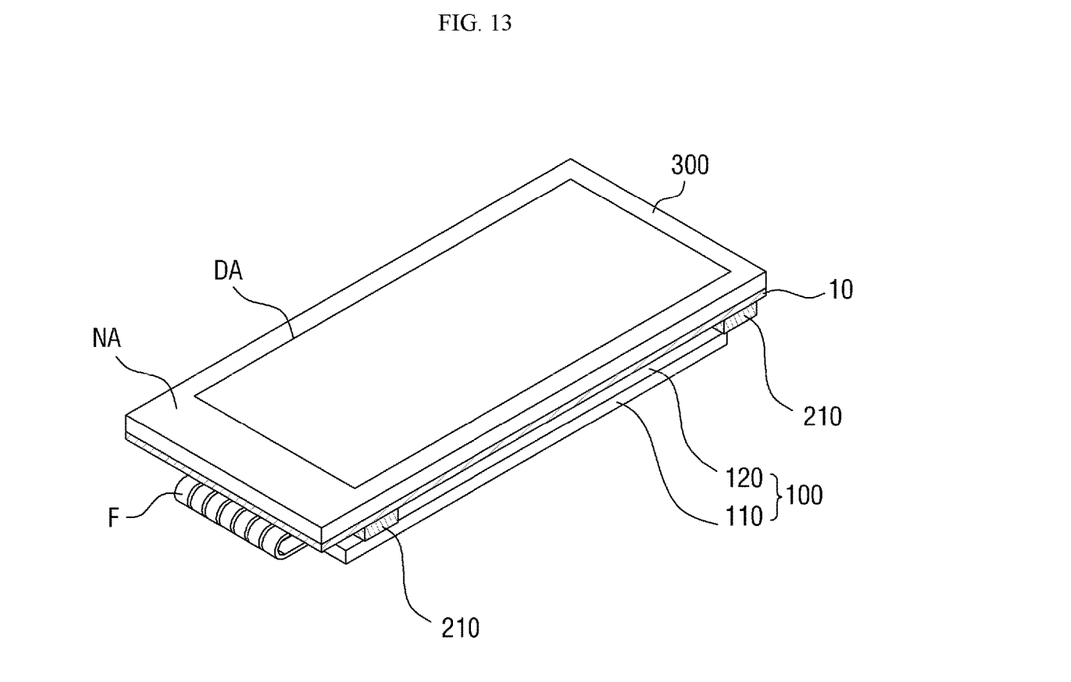

Referring to FIG. 13, in an embodiment, an auxiliary sealing layer 210 may be formed by applying an auxiliary sealing material to side surfaces of the display panel 100 and the adhesive layer 200 and then curing the auxiliary sealing material.

The auxiliary sealing material may include a photocurable resin. A case in which the photocurable resin included in the auxiliary sealing material is the same material as the photocurable resin applied to the display panel 100 or is a material cured by light of the same wavelength as that of the light used to cure the photocurable resin applied to the display panel 100 will be described below as an example.

In an embodiment, the auxiliary sealing material may be applied to an area corresponding to each corner of the display panel 100 and the adhesive layer 200.

After the application of the auxiliary sealing material, the auxiliary sealing material may be cured by irradiating UV light again. However, a sequence of forming the auxiliary sealing layer 210 is not limited to the above example. For example, the auxiliary sealing material may be applied to the side surfaces of the display panel 100 and the photocurable resin before the window 300 is bonded to the display panel 100. Then, the window 300 may be bonded to the display panel 100, and UV light may be irradiated to form the auxiliary sealing layer 210.

According to embodiments, a pattern having an increased surface energy is placed on a window to be in contact with an adhesive layer. Therefore, the adhesion between the window, the adhesive layer, and a display panel can be improved significantly.

However, the effects of the present inventive concept are not restricted to those set forth herein. The above and other effects of the present inventive concept will become more apparent to one of ordinary skill in the art to which the inventive concept pertains by reference to the claims.

While the present invention has been particularly illustrated and described with reference to some exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A method of manufacturing a display device, the method comprising:
   applying a photocurable resin to a display panel using a resin discharge nozzle;
   bonding a window including a first pattern and a second pattern to the display panel such that at least a portion of the applied resin is in contact with a lower surface of the second pattern; and
   curing the applied resin by irradiating light to the applied resin,
   wherein the first pattern and the second pattern, which is arranged in contact with a first portion of a lower surface of the first pattern and has a higher surface free energy than the first pattern, are arranged at a lower surface of the window, and a second portion of the lower surface of the first pattern is exposed.

2. The method of claim 1, wherein the nozzle is a slit nozzle configured to surface-apply the applied resin.

3. The method of claim 1, wherein the applied resin is incompletely cured by irradiating light to the applied resin before the bonding of the window.

4. The method of claim 1, further comprising:
   additionally applying a photocurable resin to a side surface of the display panel and a side surface of the cured resin; and
   curing the additionally applied resin by irradiating light to the additionally applied resin.

5. The method of claim 4, wherein the light irradiated to the applied resin and the light irradiated to the additionally applied resin have a same wavelength.

* * * * *